(12) United States Patent
Yamawaku et al.

(10) Patent No.: US 8,824,875 B2
(45) Date of Patent: Sep. 2, 2014

(54) METHOD FOR HEATING PART IN PROCESSING CHAMBER OF SEMICONDUCTOR MANUFACTURING APPARATUS AND SEMICONDUCTOR MANUFACTURING APPARATUS

(75) Inventors: Jun Yamawaku, Yamanashi (JP); Chishio Koshimizu, Yamanashi (JP); Tatsuo Matsudo, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 716 days.

(21) Appl. No.: 13/034,858

(22) Filed: Feb. 25, 2011

(65) Prior Publication Data

US 2011/0211817 A1 Sep. 1, 2011

Related U.S. Application Data

(60) Provisional application No. 61/282,660, filed on Mar. 15, 2010.

(30) Foreign Application Priority Data

Feb. 26, 2010 (JP) .................................. 2010-042036

(51) Int. Cl.
*A21B 2/00* (2006.01)
*F26B 19/00* (2006.01)

(52) U.S. Cl.
USPC ............................ 392/416; 392/407; 392/418

(58) Field of Classification Search
None
See application file for complete search history.

(56) References Cited

U.S. PATENT DOCUMENTS

| 5,155,336 | A | * | 10/1992 | Gronet et al. | ................. | 219/411 |
| 5,997,175 | A | * | 12/1999 | Champetier et al. | .......... | 374/126 |
| 6,034,357 | A | * | 3/2000 | Guardado | ..................... | 219/390 |
| 6,075,922 | A | * | 6/2000 | Tay et al. | ...................... | 392/416 |
| 6,310,328 | B1 | * | 10/2001 | Gat | ............................... | 219/411 |
| 6,434,327 | B1 | * | 8/2002 | Gronet et al. | ................. | 392/416 |
| 2010/0213171 | A1 | | 8/2010 | Koshimizu et al. | | |

FOREIGN PATENT DOCUMENTS

| JP | 2000-235972 A | 8/2000 |
| JP | 2003-332240 A | 11/2003 |
| JP | 2008-159931 A | 7/2008 |
| JP | 2010-062197 A | 3/2010 |

* cited by examiner

*Primary Examiner* — Thor Campbell
(74) *Attorney, Agent, or Firm* — Pearne & Gordon LLP

(57) ABSTRACT

There is provided a method for heating a part within a processing chamber of a semiconductor manufacturing apparatus having a substrate in the processing chamber and performing a process on the substrate. The heating method includes generating heating lights which is generated by a heating light source provided outside the processing chamber and has a wavelength band capable of passing through a first part in the processing chamber and being absorbed into a second part in the processing chamber made of a material different from that of the first part, and heating the second part in the processing chamber by passing the heating lights through the first part in the processing chamber and irradiating the heating lights to the second part in the processing chamber.

5 Claims, 9 Drawing Sheets

METHOD FOR HEATING PART IN PROCESSING CHAMBER OF SEMICONDUCTOR MANUFACTURING APPARATUS AND SEMICONDUCTOR MANUFACTURING APPARATUS

CROSS-REFERENCE TO RELATED APPLICATION

This application claims the benefit of Japanese Patent Application No. 2010-042036 filed on Feb. 26, 2010 and U.S. Provisional Application Ser. No. 61/282,660 filed on Mar. 15, 2010, the entire disclosures of which are incorporated herein by reference.

FIELD OF THE INVENTION

The present disclosure relates to a method for heating a part in a processing chamber of a semiconductor manufacturing apparatus such as a plasma processing apparatus and also relates to a semiconductor manufacturing apparatus.

BACKGROUND OF THE INVENTION

Conventionally, in a semiconductor device manufacturing process performed by a semiconductor manufacturing apparatus, a substrate such as a semiconductor wafer or a glass substrate for liquid crystal display has been accommodated in an airtightly sealed processing chamber and an etching process or a film forming process has been performed by plasma or the like in the processing chamber.

Further, by way of example, as a method for heating a part in the processing chamber of the semiconductor manufacturing apparatus, it has been known that in order to heat a focus ring surrounding a semiconductor wafer mounted on a mounting table, a resistance heater is installed for the focus ring.

However, by way of example, in a semiconductor manufacturing apparatus which generates plasma by a high frequency power in a processing chamber, an abnormal electric discharge may be generated toward a wiring for supplying electric power to a heater of a focus ring and the high frequency power may leak from the wiring. For this reason, it has been known that an induction heating unit is installed within the focus ring and the focus ring is inductively heated by a magnetic field generated by an induction coil provided in the vacuum processing chamber (see, for example, Patent Document 1).
Patent Document 1: Japanese Patent Laid-open Publication No. 2008-159931

As described above, as a technology of heating a part in the processing chamber of the semiconductor manufacturing apparatus, it has been known that an induction heating unit is installed within a focus ring and the focus ring is inductively heated by a magnetic field generated by an induction coil provided in a vacuum processing chamber. However, in order to perform the induction heating process, the induction heating unit needs to be installed within the focus ring and also the induction coil needs to be installed. Thus, it may be required to redesign the apparatus and manufacturing costs may increase.

BRIEF SUMMARY OF THE INVENTION

In view of the foregoing, the present disclosure provides a method for heating a part in a processing chamber of a semiconductor manufacturing apparatus having a simple and easy configuration capable of efficiently heating the part in the processing chamber and also provides a semiconductor manufacturing apparatus.

In accordance with an aspect of the present disclosure, there is provided a method for heating a part within a processing chamber of a semiconductor manufacturing apparatus having a substrate in the processing chamber and performing a process on the substrate. The heating method includes generating heating lights which is generated by a heating light source provided outside the processing chamber and has a wavelength band capable of passing through a first part in the processing chamber and being absorbed into a second part in the processing chamber made of a material different from that of the first part, and heating the second part in the processing chamber by passing the heating lights through the first part in the processing chamber and irradiating the heating lights to the second part in the processing chamber.

In accordance with another aspect of the present disclosure, there is provided a semiconductor manufacturing apparatus having a substrate in a processing chamber and performing a process on the substrate. The semiconductor manufacturing apparatus includes a first part provided in the processing chamber; a second part provided in the processing chamber and made of a material different from that of the first part in the processing chamber; and a heating light source, provided outside the processing chamber, for generating heating lights having a wavelength band capable of passing through the first part in the processing chamber and being absorbed into the second part in the processing chamber. Here, the heating lights from the heating light source may pass through the first part in the processing chamber and may be irradiated to the second part in the processing chamber to heat the second part in the processing chamber.

In accordance with the present disclosure, it is possible to provide a method for heating a part in a processing chamber of a semiconductor manufacturing apparatus having a simple and easy configuration capable of efficiently heating the part in the processing chamber and a semiconductor manufacturing apparatus.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Figure 1:
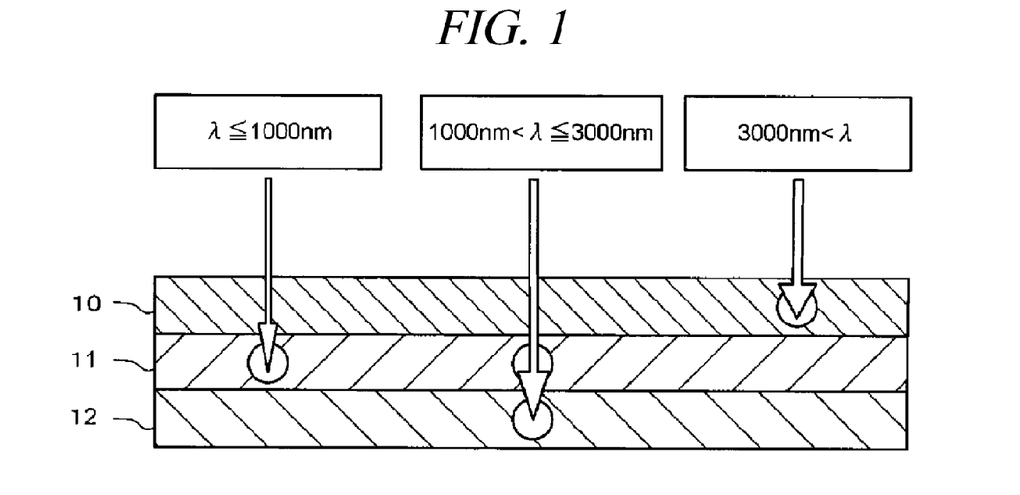
FIG. 1 is a view for explaining a method for heating a part in a processing chamber of a semiconductor manufacturing apparatus in accordance with an embodiment of the present disclosure.

Hereinafter, embodiments of the present disclosure will be described in detail with reference to the accompanying drawings. FIG. 1 is a view for explaining a method for heating a part in a processing chamber of a semiconductor manufacturing apparatus in accordance with the present embodiment.

In an example illustrated in FIG. 1, as parts within the processing chamber of the semiconductor manufacturing apparatus, a part 10 made of quartz is provided at an uppermost position of a processing chamber; a part 11 made of silicon is provided under the quartz part 10; and a part 12 made of ceramic such as alumina is provided under the silicon part 11. It may be possible to use a part made of silicon carbide (SiC) or carbon (C) in the processing chamber instead of using the silicon part 11 in the processing chamber. It may be possible to use a part coated with a diamond-like carbon film in the processing chamber instead of using the silicon part 11 in the processing chamber and it may be possible to use a part made of aluminum of which a surface is anodically oxidized (alumite treated) in the processing chamber instead of using the ceramic part 12 in the processing chamber.

Figure 3:
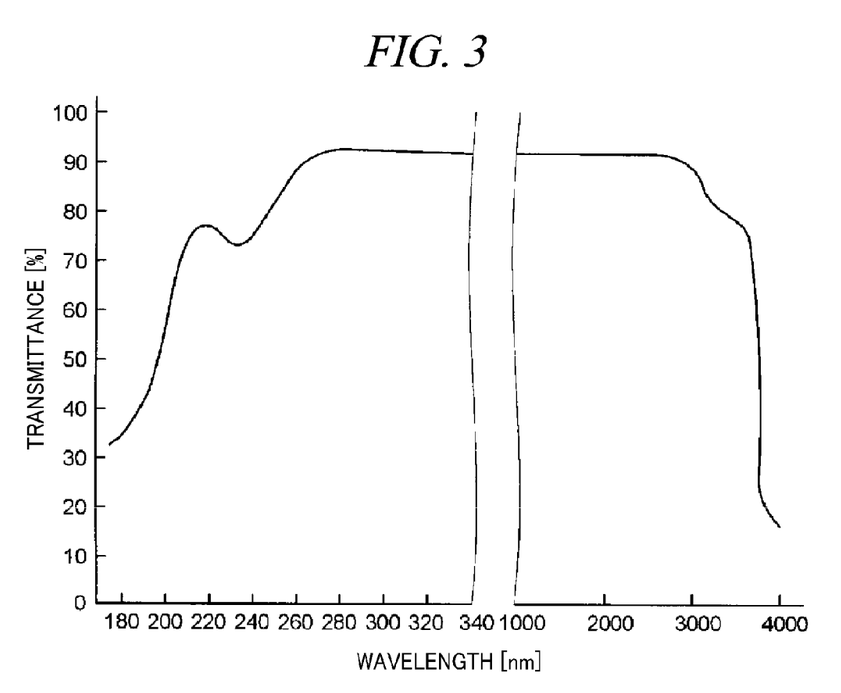
FIG. 3 is a graph showing a relationship between a wavelength and a transmittance in case of a quartz part.

In a graph of FIG. 3, a vertical axis represents a transmittance and a horizontal axis represents a wavelength, and FIG. 3 shows a relationship between a wavelength and a transmittance of light in case of a quartz part (thickness of about 2 mm). As depicted in FIG. 3, quartz has a high transmittance to a light having a wavelength band of less than about 3000 nm. However, when a wavelength band is shorter than about 200 nm, the transmittance of quartz becomes decreased.

Figure 4:
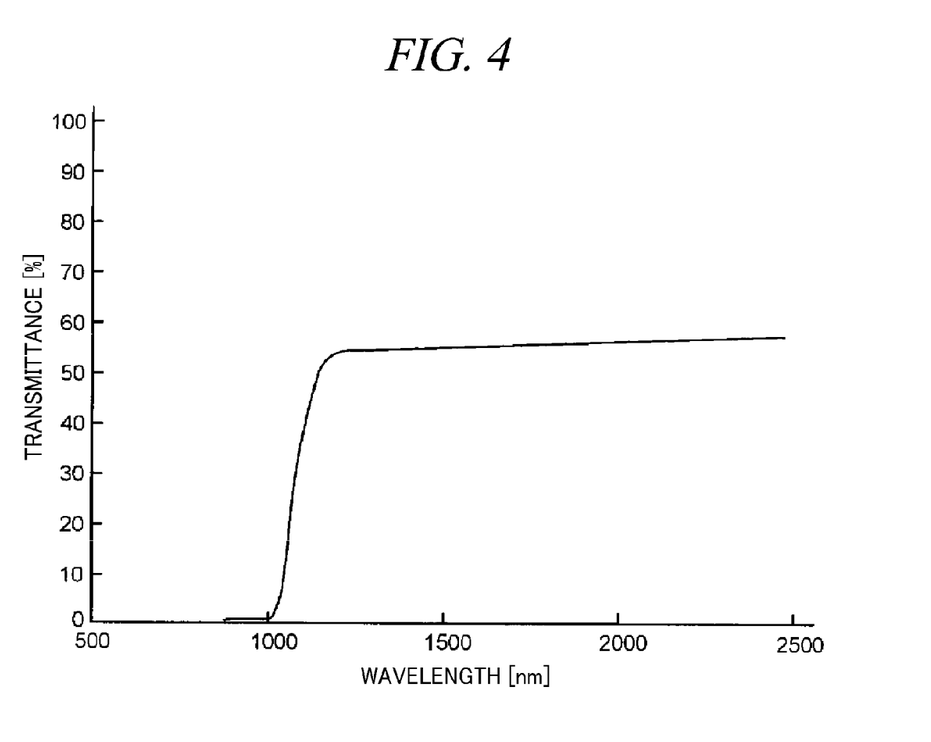
FIG. 4 is a graph showing a relationship between a wavelength and a transmittance in case of a silicon part.

In a graph in FIG. 4, a vertical axis represents a transmittance and a horizontal axis represents a wavelength and FIG. 4 shows a relationship between a wavelength and a transmittance of light in case of a single crystalline silicon part (thickness of about 0.8 mm). As depicted in FIG. 4, single crystalline silicon has a constant transmittance (about 50% in the example of FIG. 4) to a light having a wavelength band longer than about 1000 nm but hardly transmits a light having a wavelength band of about 1000 nm or lower.

Figure 5:
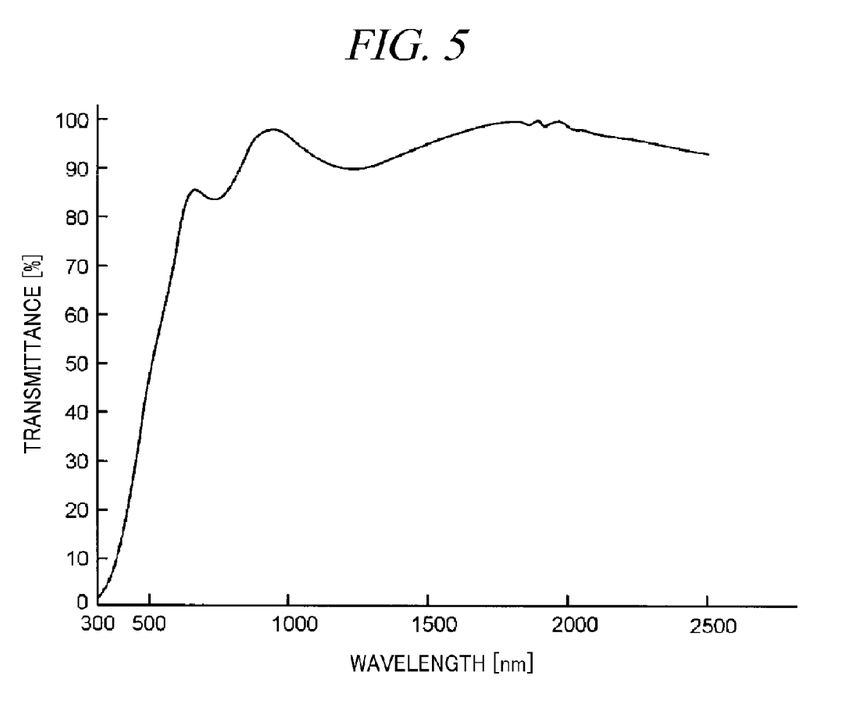
FIG. 5 is a graph showing a relationship between a wavelength and a transmittance in case of a diamond-like carbon part.

In a graph in FIG. 5, a vertical axis represents a transmittance and a horizontal axis represents a wavelength and FIG. 5 shows a relationship between a wavelength and a transmittance of light in case of a diamond-like carbon part (thickness of about 5 μm). As depicted in FIG. 5, diamond-like carbon has a high transmittance to a light having a wavelength band of about 600 nm or higher and a low transmittance to a light having a wavelength band of less than about 500 nm.

As can be seen from the relationships between the wavelength and the transmittance of light shown in FIGS. 3 to 5, in case of using heating lights having a wavelength band of about 1000 nm or lower (but about 200 nm or higher), the heating lights may pass through the quartz part 10 in the processing chamber and may be irradiated to and absorbed into the silicon part 11 in the processing chamber, thereby heating the silicon part 11 in the processing chamber. In this case, if a light source having a wide wavelength band such as a lamp is used, it may be possible to use a light source having power of which more than half is originated from a wavelength band of about 1000 nm or lower. Alternatively, if a part made of diamond-like carbon in the processing chamber is used instead of using the silicon part 11 in the processing chamber, it is desirable to use heating lights having a wavelength band shorter than about 500 nm (but longer than about 200 nm). Since the diamond-like carbon has a broad transmission characteristic, even if it is used as a surface protection material of a part in the processing chamber, it is possible to heat the part in the processing chamber without damaging a heating characteristic of the protected part in the processing chamber.

Further, in case of using heating lights having a wavelength band longer than about 1000 nm and shorter than about 3000 nm, the heating lights may pass through the quartz part 10 in the processing chamber and may be irradiated to and absorbed into the silicon part 11 in the processing chamber, and, thus, the silicon part 11 in the processing chamber can be heated. At the same time, about a half of the heating lights passing through the silicon part in the processing chamber may be irradiated to and absorbed into the ceramic part 12 in the processing chamber, thereby heating the ceramic part 12 in the processing chamber. In this case, if a light source having a wide wavelength band such as a lamp is used, it may be possible to use a light source having power of which more than half is originated from a wavelength band longer than about 1000 nm and shorter than about 3000 nm.

Figure 2:
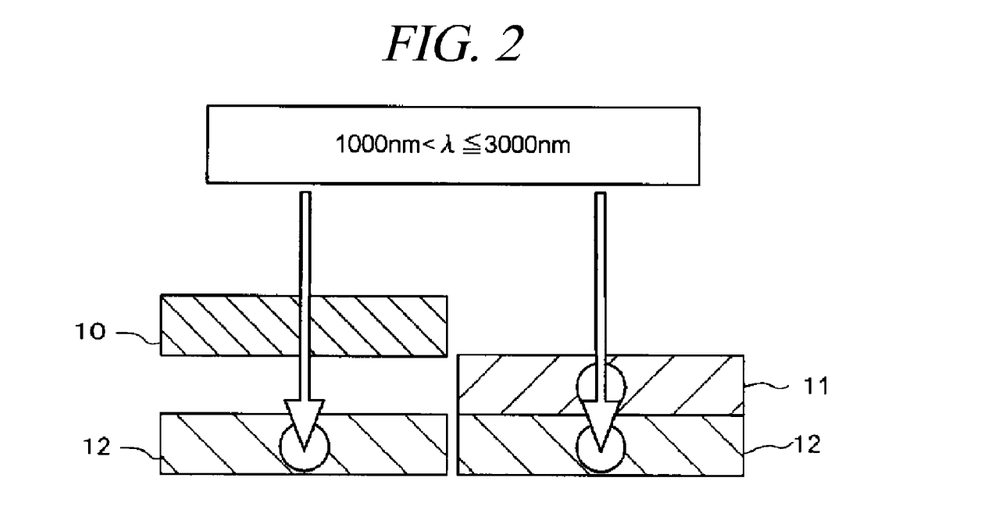
FIG. 2 is a view for explaining a method for heating the part in the processing chamber of the semiconductor manufacturing apparatus in accordance with another embodiment of the present disclosure.

In this way, as depicted in FIG. 2, in case of using the heating lights having the wavelength band longer than about 1000 nm and shorter than about 3000 nm, the heating lights may pass through only the quartz part 10 in the processing chamber and heat the ceramic part 12 in the processing chamber or the heating lights may pass through (partially absorbed into) the silicon part 11 in the processing chamber and heat both the silicon part 11 and the ceramic part 12 in the processing chamber.

Further, as depicted on the right side of FIG. 1, in case of using heating lights having a wavelength band longer than about 3000 nm, it may be possible to heat the quartz part 10 provided at the uppermost position of the processing chamber.

Figure 6:
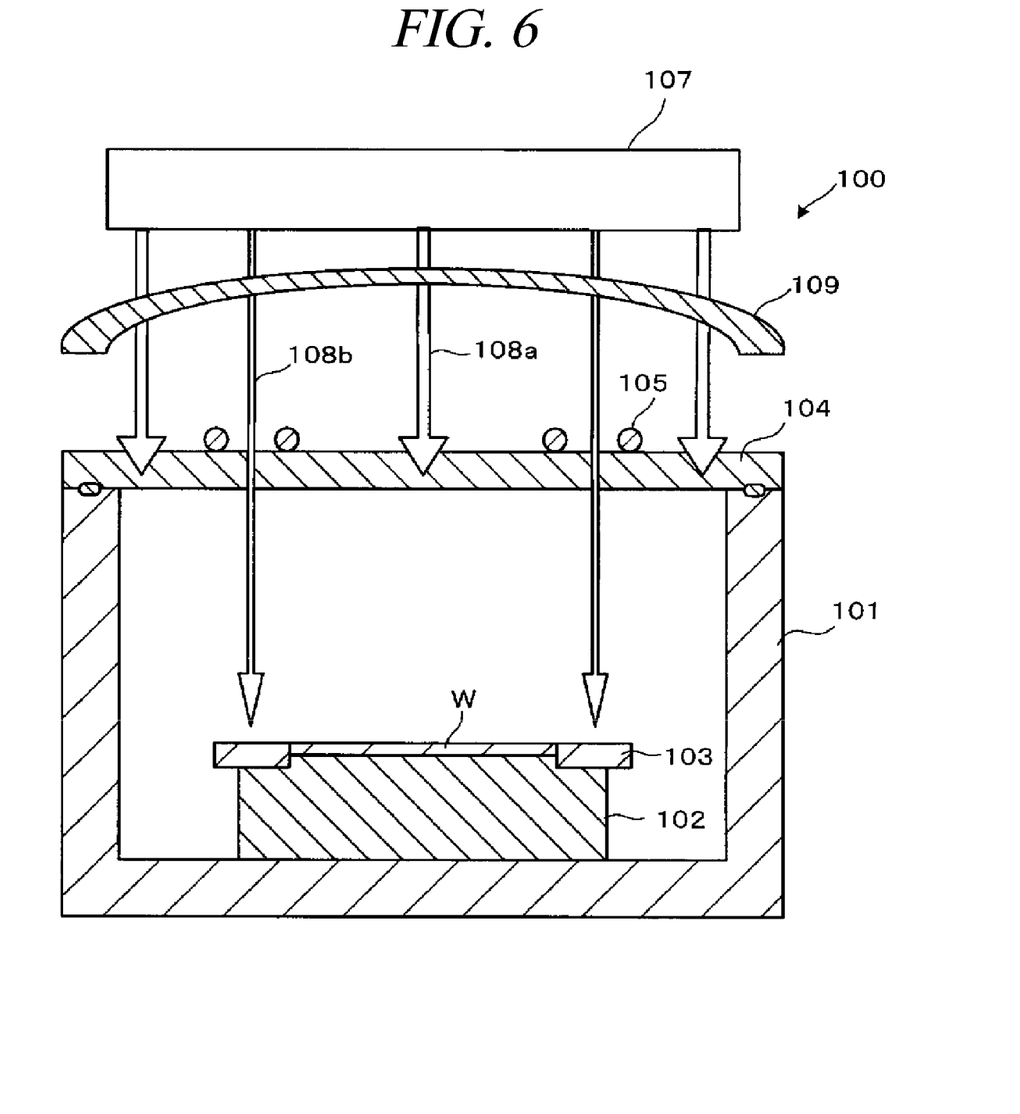
FIG. 6 shows a schematic configuration of a semiconductor manufacturing apparatus in accordance with an embodiment of the present disclosure.

FIG. 6 shows a configuration of a semiconductor manufacturing apparatus 100 in accordance with an embodiment of the present disclosure. The semiconductor manufacturing apparatus 100 includes a processing chamber 101 of which the inside can be airtightly sealed and a mounting table 102 for mounting a semiconductor wafer W as a substrate to be processed in the processing chamber 101. On an upper surface (mounting surface) of the mounting table 102, a circular ring-shaped focus ring 103 is mounted so as to surround the semiconductor wafer W. The focus ring 103 is made of silicon and the focus ring 103 is one of silicon parts in the processing chamber.

At a ceiling of the processing chamber 101, a top plate 104 is installed. The top plate 104 is made of quartz and the top plate 104 is one of quartz parts in the processing chamber. A conductive coil 105 is provided outside the top plate 104. By flowing a high frequency current to the coil 105, a processing gas within the processing chamber 101 may be excited into plasma to generate inductively coupled plasma (ICP).

Provided above the coil 105 is a heating light source unit 107 including a multiple number of heating light sources. The heating light source unit 107 is configured to irradiate heating lights 108a having a wavelength band longer than about 3000 nm and heating lights 108b having a wavelength band of about 1000 nm or lower (but about 200 nm or higher).

The heating lights 108a may be absorbed into the top plate 104 and used for heating the top plate 104. The heating lights 108b may pass through the top plate 104; may be absorbed into the focus ring 103; and used for heating the focus ring 103. Further, a reference numeral 109 of FIG. 6 denotes a reflecting plate which again reflects the heating lights 108a and 108b reflected from a surface of the top plate 104 to contribute to heating.

Figure 7A:
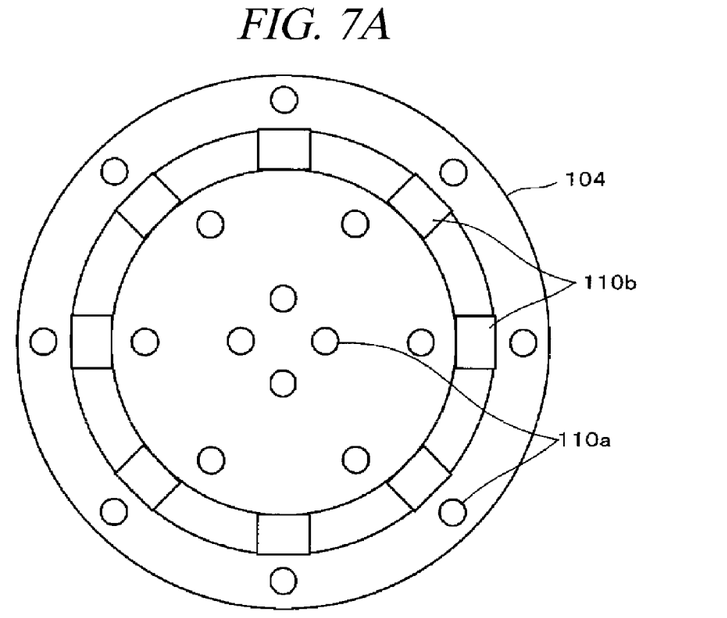
FIGS. 7A and 7B show a schematic configuration of a major part of the semiconductor manufacturing apparatus shown in FIG. 6.
Figure 7B:
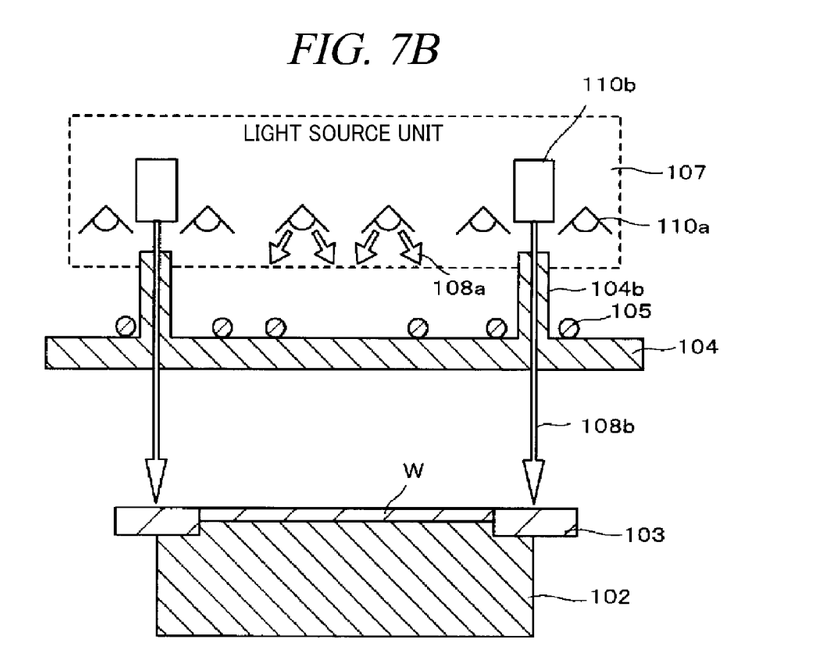

FIGS. 7A and 7B show detailed configurations of the heating light source unit 107 and the top plate 104. To be specific, FIG. 7A shows a configuration thereof when viewed from the top and FIG. 7B shows a configuration thereof when viewed from the side. As depicted in FIGS. 7A and 7B, heating light sources 110b for generating the heating lights 108b are arranged along a shape of the focus ring 103 and heating light sources 110a for generating the heating lights 108a are uniformly distributed on the top plate 104.

Further, in order to efficiently irradiate the heating lights 108b from the heating light source 110b to the focus ring 103, as depicted in FIG. 7B, an inlet 104b of the heating lights 108b is provided at the top plate 104. The inlet 104b is of a cylindrical shape and made of quartz. The heating lights 108b may pass through the inside of the inlet 104b.

Figure 8A:
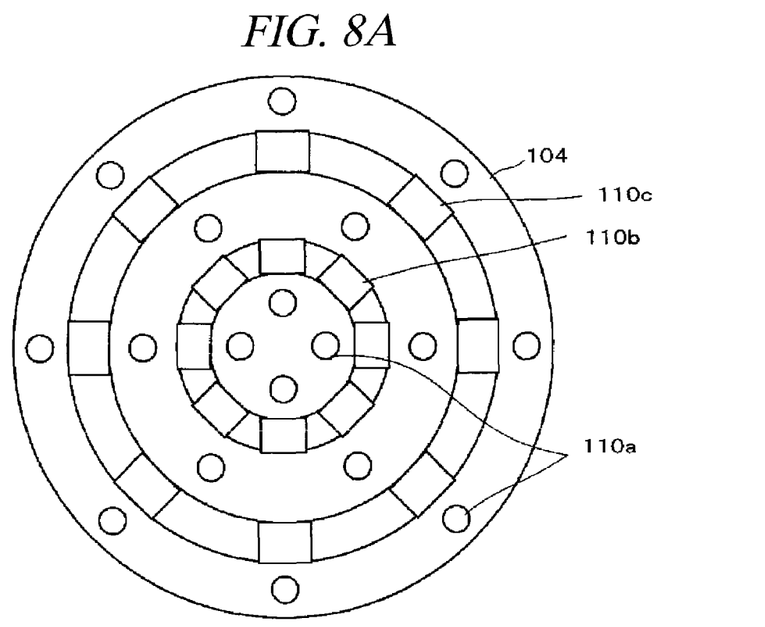
FIGS. 8A and 8B show a schematic configuration of a major part of a modification example of the semiconductor manufacturing apparatus shown in FIG. 6.
Figure 8B:
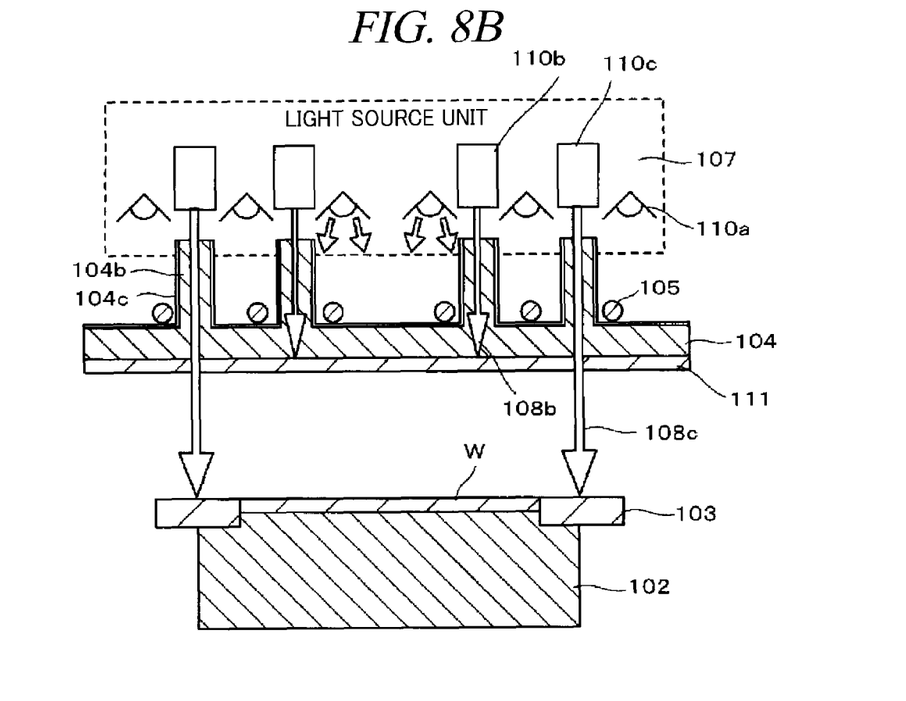

FIGS. 8A and 8B show configurations of the heating light source unit 107 and the top plate 104 in accordance with a modification example. In this modification example, a silicon film 111 is formed on a bottom surface of the top plate 104 and the silicon film 111 is heated by the heating lights 108b from the heating light source 110b. For this reason, installed above the focus ring 103 is a heating light source 110c for irradiating heating lights 108c having a wavelength band longer than about 1000 nm and shorter than about 3000 nm. The heating lights 108c from the heating light source 110c may pass through the top plate 104 and a part of the heating lights 108c may be absorbed into the silicon film 111. The passed light 108c may be irradiated to and absorbed into the focus ring 103 to heat the focus ring 103.

In case of using a diamond-like carbon film instead using of the silicon film 111, as the heating light source 110b for heating the diamond-like carbon film, it is desirable to use a light source which generates heating lights having a wavelength band longer than about 200 nm and shorter than about 500 nm. The heating lights having such a wavelength band may pass through the top plate 104 and may be absorbed into the diamond-like carbon film, thereby heating the diamond-like carbon film.

Further, as the heating light source 110c for heating the focus ring 103, it is desirable to use a light source which generates heating lights having a wavelength band longer than about 600 nm and shorter than about 1000 nm. The heating lights having such a wavelength band may pass through the top plate 104 and the diamond-like carbon film and may be absorbed into the focus ring 103, thereby heating the focus ring 103.

Furthermore, desirably, on a sidewall 104c of the inlet 104b for introducing the heating lights 108b and 108c, a film may be formed or a surface processing may be performed such that the heating lights 108b and 108c do not leak to the outside by being totally reflected from the inside of the inlet 104b.

Figure 9:
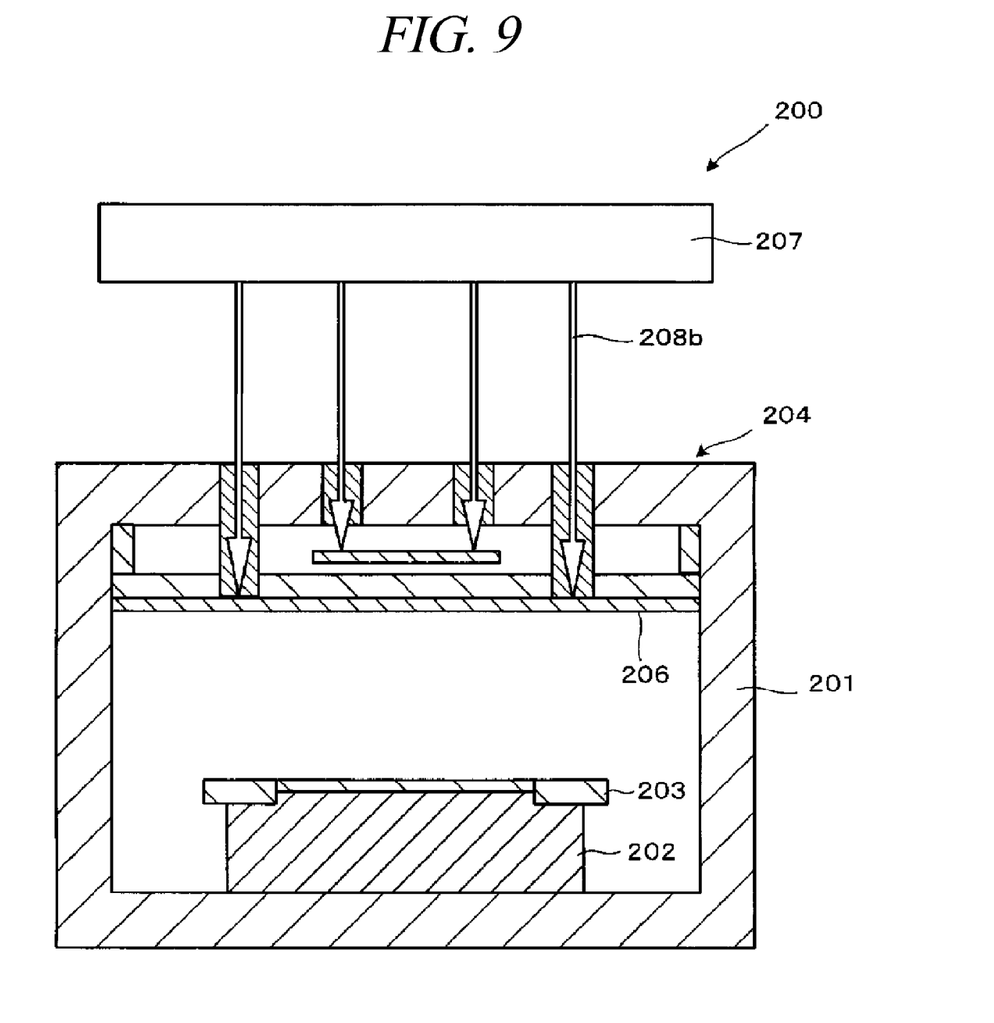
FIG. 9 shows a schematic configuration of a semiconductor manufacturing apparatus in accordance with another embodiment of the present disclosure.

FIG. 9 shows a configuration of a semiconductor manufacturing apparatus 200 in accordance with another embodiment. The semiconductor manufacturing apparatus 200 includes a processing chamber 201 of which the inside can be airtightly sealed, and a mounting table 202 for mounting a semiconductor wafer W as a substrate to be processed in the processing chamber 201. On an upper surface (mounting surface) of the mounting table 202, a circular ring-shaped focus ring 203 is mounted so as to surround the semiconductor wafer W. The focus ring 203 is made of silicon and the focus ring 203 is one of silicon parts in the processing chamber.

The mounting table 202 serves as a lower electrode and a shower head 204 serving as an upper electrode is installed at a ceiling of the processing chamber 201 so as to face the mounting table 202.

Figure 10A:
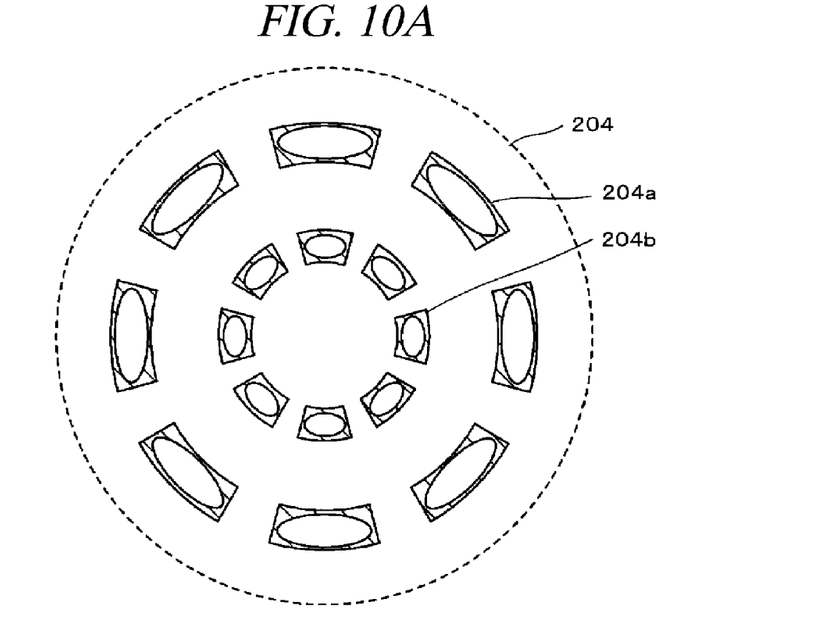
FIGS. 10A and 10B show a schematic configuration of a major part of the semiconductor manufacturing apparatus shown in FIG. 9.
Figure 10B:
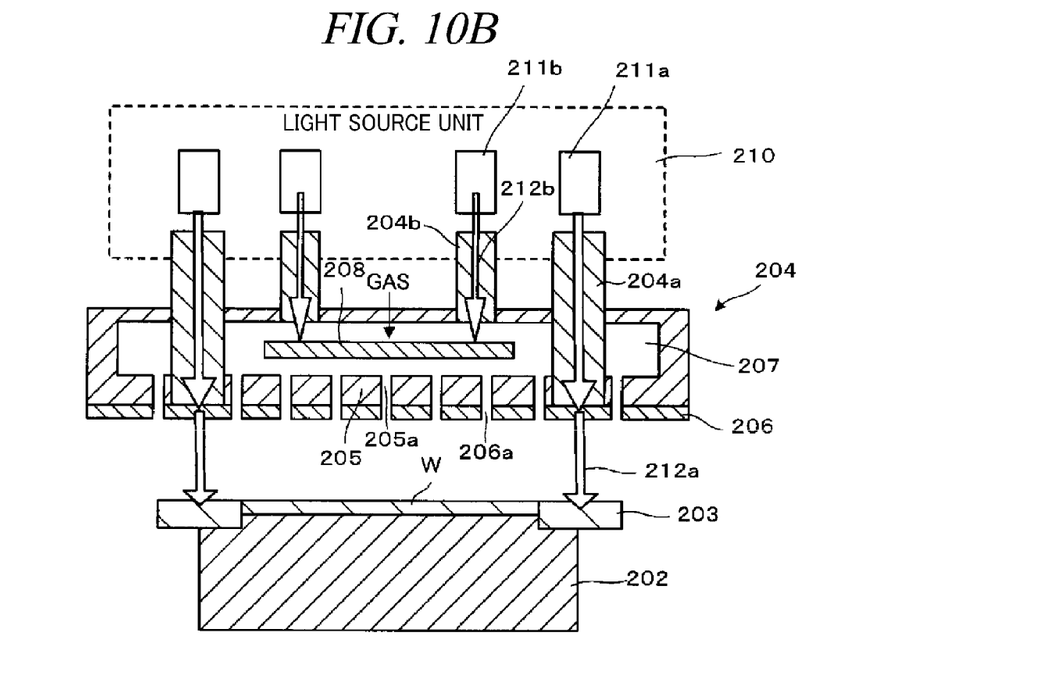

As depicted in FIG. 10B, provided in the shower head 204 is an electrode plate 205 including a multiple number of through holes 205a for supplying a processing gas in a shower pattern. A bottom surface of the electrode plate 205 is covered with a silicon plate 206 including a multiple number of through holes 206a in the same manner as the electrode plate 205. The silicon plate 206 is one of silicon parts in the processing chamber.

Above the electrode plate 205, a gas diffusion space 207 for diffusing the processing gas is formed. A gas diffusion plate 208 is provided in the gas diffusion space 207. The gas diffusion plate 208 is made of ceramic (alumina in the present embodiment).

In the semiconductor manufacturing apparatus 200 configured as described above, the processing gas introduced into the processing chamber 201 from the shower head 204 is excited into plasma by a high frequency power applied between the mounting table 202 serving as a lower electrode and the shower head 204 serving as an upper electrode and the semiconductor wafer W mounted on the mounting table 202 is processed by the plasma.

In an upper outside of the processing chamber 201, there is provided a heating light source unit 210 including a multiple number of heating light sources 211a and 211b. The heating light source 211a is configured to irradiate heating lights 212a having a wavelength band longer than about 1000 nm and shorter than about 3000 nm. The heating lights 212a may pass through a multiple number of light inlets 204a, made of quartz, provided in the shower head 204 and a part of the heating lights may be absorbed into the silicon plate 206, and, thus, the silicon plate 206 may be heated. The heating lights 212a passing through the silicon plate 206 may be irradiated to and absorbed into the focus ring 203, thereby heating the focus ring 203.

Further, the heating light source 211b is configured to irradiate heating lights 212b having a wavelength band of about 1000 nm or lower (but about 200 nm or higher). The heating lights 212b may pass through a multiple number of light inlets 204b, made of quartz, provided in the shower head 204 and may be irradiated to and absorbed into the gas diffusion plate 208, thereby heating the gas diffusion plate 208.

As depicted in FIG. 10A, the light inlets 204a are distributed in an annular area corresponding to a position of the focus ring 203. Further, the light inlets 204b are distributed in an annular area positioned on an inner side of the light inlets 204a. Each heating light source 211a is provided to correspond to each light inlet 204a and each heating light source 211b is provided to correspond to each light inlet 204b.

As described above, in each embodiment, it is possible to heat parts in the processing chamber with a simple and easy configuration. Further, the present invention is not limited to the above-described embodiments and can be modified and changed in various ways.

What is claimed is:

1. A method for heating a part within a processing chamber of a semiconductor manufacturing apparatus having a substrate in the processing chamber and performing a process on the substrate, the method comprising:

generating first heating lights having a first wavelength band capable of being absorbed into a first part in the processing chamber, the first heating lights being generated by a first heating light source provided outside the processing chamber, generating second heating lights having a second wavelength band capable of passing through the first part in the processing chamber and being absorbed into a second part in the processing chamber made of a material different from that of the first part, the second heating lights being generated by a second heating light source provided outside the processing chamber, and heating the first part in the processing chamber by irradiating the first heating lights to the first part in the processing chamber, and heating the second part in the processing chamber by passing the second heating lights through the first part in the processing chamber and irradiating the second heating lights to the second part in the processing chamber.

2. The heating method of claim 1, wherein the first part in the processing chamber is made of quartz and the second part in the processing chamber is made of silicon, silicon carbide (SiC) or carbon (C).

3. The method of claim 2, wherein more than half of power of the second heating lights is originated from a wavelength band of about 1000 nm or lower.

4. The method of claim 1, wherein the first part in the processing chamber is made of at least one of quartz and silicon and more than half of power of the second heating lights is originated from a wavelength band longer than about 1000 nm and shorter than about 3000 nm.

5. A semiconductor manufacturing apparatus having a substrate in a processing chamber and performing a process on the substrate, the apparatus comprising:

a first part provided in the processing chamber;

a second part provided in the processing chamber and made of a material different from that of the first part in the processing chamber;

a first heating light source, provided outside the processing chamber, for generating first heating lights having a wavelength band capable of being absorbed into the first part in the processing chamber; and a second heating light source, provided outside the processing chamber, for generating second heating lights having a wavelength band capable of passing through the first part in the processing chamber and being absorbed into the second part in the processing chamber, wherein the first heating lights from the first heating light source are irradiated to the first part in the processing chamber to heat the first part in the processing chamber, and the second heating lights from the second heating light source pass through the first part in the processing chamber and are irradiated to the second part in the processing chamber to heat the second part in the processing chamber.

* * * * *

UNITED STATES PATENT AND TRADEMARK OFFICE
CERTIFICATE OF CORRECTION

| | |
|---|---|
| PATENT NO. | : 8,824,875 B2 |
| APPLICATION NO. | : 13/034858 |
| DATED | : September 2, 2014 |
| INVENTOR(S) | : Jun Yamawaku et al. |

Page 1 of 1

It is certified that error appears in the above-identified patent and that said Letters Patent is hereby corrected as shown below:

In the Specification,

Column 4, line 23, please add "11" between -- part -- and -- in --

Signed and Sealed this
Thirtieth Day of December, 2014

Michelle K. Lee
*Deputy Director of the United States Patent and Trademark Office*